(12) United States Patent
Hong et al.

(10) Patent No.: US 8,754,325 B2
(45) Date of Patent: Jun. 17, 2014

(54) THIN FILM TYPE SOLAR CELL AND METHOD FOR MANUFACTURING THE SAME

(75) Inventors: Jin Hong, Gyeonggi-do (KR); Jae Ho Kim, Gyeonggi-do (KR); Joung Sik Kim, Gyeonggi-do (KR)

(73) Assignee: Jusung Engineering Co., Ltd. (KR)

( * ) Notice: Subject to any disclaimer, the term of this patent is extended or adjusted under 35 U.S.C. 154(b) by 923 days.

(21) Appl. No.: 12/739,737

(22) PCT Filed: Oct. 30, 2008

(86) PCT No.: PCT/KR2008/006393
§ 371 (c)(1),
(2), (4) Date: Apr. 25, 2010

(87) PCT Pub. No.: WO2009/057951
PCT Pub. Date: May 7, 2009

(65) Prior Publication Data
US 2010/0258159 A1  Oct. 14, 2010

(30) Foreign Application Priority Data

Nov. 2, 2007 (KR) .......................... 10-2007-0111304
Oct. 2, 2008 (KR) .......................... 10-2008-0097208

(51) Int. Cl.
*H01L 31/05* (2014.01)
(52) U.S. Cl.
USPC .......................................... 136/256; 136/244

(58) Field of Classification Search
USPC ................................................. 136/244, 256
See application file for complete search history.

(56) References Cited

U.S. PATENT DOCUMENTS

| 4,758,526 A | 7/1988 | Thalheimer |
| 2010/0089435 A1* | 4/2010 | Lockenhoff .................. 136/246 |

FOREIGN PATENT DOCUMENTS

| JP | 03-239377 | 10/1991 |
| JP | 11-026795 | 1/1999 |
| JP | 2006-059991 | 3/2006 |
| JP | 2006-080217 | 3/2006 |

* cited by examiner

*Primary Examiner* — Jonathan Johnson
*Assistant Examiner* — Christina Chern

(57) ABSTRACT

A thin film type solar cell and a method for manufacturing the same is disclosed, the thin film type solar cell comprising a substrate; front electrodes arranged at fixed intervals on the substrate by separating parts for dividing the solar cell into a plurality of unit cells, wherein each separating part is interposed between the front electrodes; semiconductor layer patterns arranged at fixed intervals on the front electrodes by the interposed separating parts; rear electrodes arranged at fixed intervals on the semiconductor layer patterns by the interposed separating parts; and auxiliary electrodes to electrically connect the front electrodes with the rear electrodes, in which the front electrode is electrically connected with the rear electrode through the use of auxiliary electrode, so that it is possible to minimize the laser-scribing procedure for dividing the solar cell into the plurality of unit cells, thereby preventing the particles from being generated.

23 Claims, 6 Drawing Sheets

A

B

C

D

E

F

A

B

C

A

B

C

A

B

C

A

B

C

D

THIN FILM TYPE SOLAR CELL AND METHOD FOR MANUFACTURING THE SAME

CROSS-REFERENCE TO RELATED APPLICATION

This application is a U.S. national phase application of PCT International Application PCT/KR2008/006393, filed Oct. 30, 2008, which claims priority to Korean Patent Application Nos. 10-2007-0111304, filed Nov. 2, 2007 and 10-2008-0097208, filed Oct. 2, 2008, the contents of which are incorporated herein by reference in their entirety.

TECHNICAL FIELD

The present invention relates to a thin film type solar cell, and more particularly, to a thin film type solar cell including a plurality unit cells divided therein.

BACKGROUND ART

A solar cell with a property of semiconductor converts a light energy into an electric energy.

A structure and principle of the solar cell according to the related art will be briefly explained as follows. The solar cell is formed in a PN-junction structure where a positive (P)-type semiconductor makes a junction with a negative (N)-type semiconductor. When a solar ray is incident on the solar cell with the PN-junction structure, holes(+) and electrons(−) are generated in the semiconductor owing to the energy of the solar ray. By an electric field generated in an PN-junction area, the holes(+) are drifted toward the P-type semiconductor, and the electrons(−) are drifted toward the N-type semiconductor, whereby an electric power is produced with an occurrence of electric potential.

The solar cell can be largely classified into a wafer type solar cell and a thin film type solar cell.

The wafer type solar cell uses a wafer made of a semiconductor material such as silicon. In the meantime, the thin film type solar cell is manufactured by forming a semiconductor in type of a thin film on a glass substrate.

With respect to efficiency, the wafer type solar cell is better than the thin film type solar cell. However, in the case of the wafer type solar cell, it is difficult to realize a small thickness due to difficulty in performance of the manufacturing process. In addition, the wafer type solar cell uses a high-priced semiconductor substrate, whereby its manufacturing cost is increased.

Even though the thin film type solar cell is inferior in efficiency to the wafer type solar cell, the thin film type solar cell has advantages such as realization of thin profile and use of low-priced material. Accordingly, the thin film type solar cell is suitable for a mass production.

The thin film type solar cell is manufactured by sequential steps of forming a front electrode on a glass substrate, forming a semiconductor layer on the front electrode, and forming a rear electrode on the semiconductor layer. In this case, since the front electrode corresponds to a solar ray incidence face, the front electrode is made of a transparent conductive material, for example, ZnO. With the large-sized substrate, a resistance is increased in the front electrode made of the transparent conductive material, thereby causing the increase in power loss.

Thus, a method for minimizing the power loss has been proposed, in which the thin film type solar cell is divided into a plurality of unit cells, and the plurality of unit cells are connected in series. This method enables the minimization of power loss caused by the resistance of the transparent conductive material.

Hereinafter, a related art method for manufacturing a thin film type solar cell with a plurality of unit cells connected in series will be described with reference to the accompanying drawings.

FIGS. 1A to 1F are cross section views illustrating a related art method for manufacturing a thin film type solar cell with a plurality of unit cells connected in series.

First, as shown in FIG. 1A, a front electrode layer 20a is formed on a substrate 10, wherein the front electrode layer 20a is made of a transparent conductive material, for example, ZnO.

Next, as shown in FIG. 1B, predetermined portions of the front electrode layer 20a are removed through the use of laser-scribing method, thereby forming a front electrode 20.

As shown in FIG. 1C, a semiconductor layer 30a and a transparent conductive layer 40a are sequentially formed on an entire surface of the substrate 10.

As shown in FIG. 1D, a contact portion 35 for connection of the electrodes is formed by removing predetermined portions of the semiconductor layer 30a and transparent conductive layer 40a through the use of laser-scribing method, thereby forming a semiconductor layer pattern 30 and a transparent conductive layer pattern 40.

Next, as shown in FIG. 1E, a rear electrode layer 50a is formed on the entire surface of the substrate 10.

As shown in FIG. 1F, separating portions 45 are formed by removing predetermined portions of the rear electrode layer 50a through the use of laser-scribing method, thereby dividing the solar cell into a plurality of unit cells.

According as the solar cell is divided into the plurality of unit cells, and the unit cells are connected in series, the resistance of front electrode is not increased even in the large-sized substrate, thereby preventing the problem of power loss.

However, the related art method for manufacturing the thin film type solar cell necessarily requires the laser-scribing process three times. This may cause the following problems.

First, large amounts of particles may generate due to the performance of laser-scribing procedures. The generated particles may cause the problems such as a contamination of substrate and a short of device. In order to overcome these problems generated due to the particles, a cleaning procedure is additionally performed after performing the laser-scribing procedure. However, the additional cleaning procedure makes the entire process complicated, and causes the increase of manufacturing cost since it requires a cleaning apparatus.

Second, if laser is excessively supplied to the desired layer due to the inappropriate control of laser irradiation and exposing time, the lower layer positioned under the desired layer may be scribed.

DISCLOSURE OF INVENTION

Technical Problem

Therefore, the present invention has been made in view of the above problems, and it is an object of the present invention to provide a thin film type solar cell including a plurality of unit cells divided through the minimum number of scribing procedures and a method for manufacturing the same, which can minimize problems generated when performing related art laser-scribing procedures three times.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

Technical Solution

To achieve these objects and other advantages and in accordance with the purpose of the invention, as embodied and broadly described herein, a thin film type solar cell comprises a substrate; front electrodes arranged at fixed intervals on the substrate by separating parts for dividing the solar cell into a plurality of unit cells, wherein each separating part is interposed between the front electrodes; semiconductor layer patterns arranged at fixed intervals on the front electrodes by the interposed separating parts; rear electrodes arranged at fixed intervals on the semiconductor layer patterns by the interposed separating parts; and auxiliary electrodes to electrically connect the front electrodes with the rear electrodes.

At this time, the auxiliary electrodes are directly connected with the front electrodes, and are connected with the rear electrodes through a connection line.

The auxiliary electrodes may be directly connected with the lower surface of the front electrodes, or may be directly connected with the upper surface of the front electrodes.

The auxiliary electrodes are comprised of a first auxiliary electrode connected with one end of the front electrode, and a second auxiliary electrode connected with the other end of the front electrode, wherein the first and second auxiliary electrodes are arranged alternately.

The thin film type solar cell further comprises a bus line connected with one side of the outermost front electrode among the front electrodes, so as to connect the front electrode with an external circuit.

The bus line may be formed at the same layer as the auxiliary electrode.

For formation of the connection line, the front electrode, the semiconductor layer pattern, and the rear electrode are not formed on predetermined portions of the auxiliary electrode so as to expose the predetermined portions of the auxiliary electrode.

The front electrode, the semiconductor layer pattern, and the rear electrode are not formed on predetermined portions of the bus line so as to expose the predetermined portions of the bus line.

In addition, a transparent conductive layer pattern is additionally formed between the semiconductor layer pattern and the rear electrode.

The separating parts may comprise one or more straight-line grooves at a first direction, or may further comprise one or more straight-line grooves at a second direction being in perpendicular to the first direction.

Also, an insulating layer pattern is additionally formed underneath the semiconductor layer pattern so as to increase an entire size of the semiconductor layer pattern.

The insulating layer pattern may be formed on the lower surface of the front electrode, or may be formed on the upper surface of the front electrode.

The insulating layer pattern may be formed in a structure of arranging transparent insulating-material patterns with an elliptical-shaped horizontal cross section at fixed intervals.

The insulating layer pattern is higher than the auxiliary electrode.

In another aspect of the present invention, a method for manufacturing a thin film type solar cell comprises forming a front electrode layer on a substrate; forming a semiconductor layer on the front electrode layer; forming separating parts for dividing the solar cell into a plurality of unit cells by removing predetermined portions of the front electrode layer and semiconductor layer, so as to form front electrode and semiconductor layer patterns at fixed intervals by the interposed separating parts; forming rear electrodes arranged at fixed intervals on the semiconductor layer patterns by the interposed separating parts; forming auxiliary electrodes being in contact with predetermined portions of the front electrode patterns; and forming a connection line to electrically connect the auxiliary electrodes with the rear electrodes.

At this time, the auxiliary electrodes are in contact with the lower surface of the front electrodes by performing the step of forming the auxiliary electrodes before the step of forming the front electrode layer, or the auxiliary electrodes are in contact with the upper surface of the front electrodes by performing the step of forming the auxiliary electrodes after the step of forming the front electrode layer.

Also, the step of forming the auxiliary electrodes is comprised of forming a first auxiliary electrode connected with one end of the front electrode, and forming a second auxiliary electrode connected with the other end of the front electrode.

The method further comprises performing a step of forming a bus line connected with one side of the outermost front electrode so as to electrically connect the outermost front electrode with an external circuit, simultaneously with the step of forming the auxiliary electrodes.

Also, the respective steps of forming the front electrode layer, the semiconductor layer and the rear electrode are performed while masking predetermined portions, so as to expose the predetermined portions of the auxiliary electrode to the external.

The step of forming the front electrode layer, the semiconductor layer and the rear electrode is performed while masking predetermined portions, so as to expose the predetermined portions of the bus line to the external.

The method further comprises forming a transparent conductive layer on the semiconductor layer after forming the semiconductor layer, wherein the step of forming the separating parts is comprised of removing the predetermined portions of the front electrode layer, the semiconductor layer, and the transparent conductive layer.

The step of forming the separating parts comprises forming one or more straight-line grooves at a first direction, or the step of forming the separating parts further comprises forming one or more straight-line grooves at a second direction being in perpendicular to the first direction.

In order to increase an entire size of the semiconductor layer pattern, the method further comprises forming an insulating layer pattern underneath the semiconductor layer pattern.

The step of forming the insulating layer pattern is performed by forming the insulating layer pattern on the lower surface of the front electrode before forming the front electrode layer, or the step of forming the insulating layer pattern is performed by forming the insulating layer pattern on the upper surface of the front electrode after forming the front electrode layer.

The step of forming the insulating layer pattern is comprised of arranging transparent insulating-material patterns with an elliptical-shaped horizontal cross section at fixed intervals.

Also, the step of forming the insulating layer pattern is performed to obtain the insulating layer pattern which is higher than the auxiliary electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

BEST MODE FOR CARRYING OUT THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a thin film type solar cell according to the present invention and a method for manufacturing the same will be described with reference to the accompanying drawings.

Thin Film Type Solar Cell

First Embodiment

Figure 1:
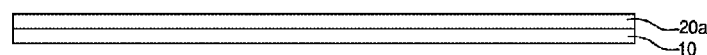
FIGS. 1A to 1F are cross section views illustrating a related art method for manufacturing a thin film type solar cell including a plurality of unit cells connected in series.
Figure 1:
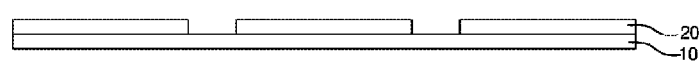
Figure 1:
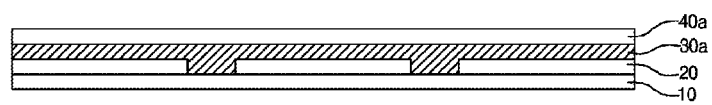
Figure 1:
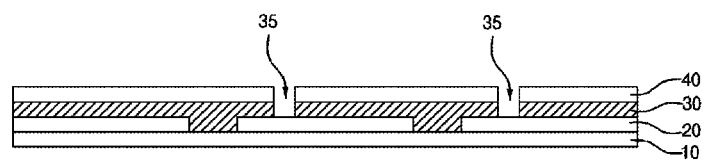
Figure 1:
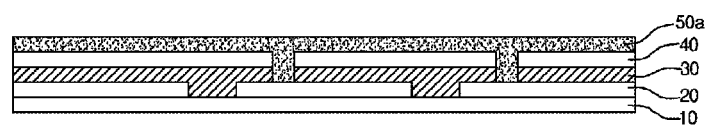
Figure 1:
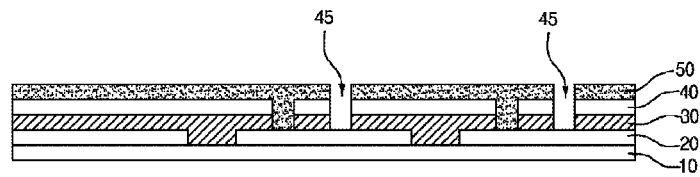
Figure 2:
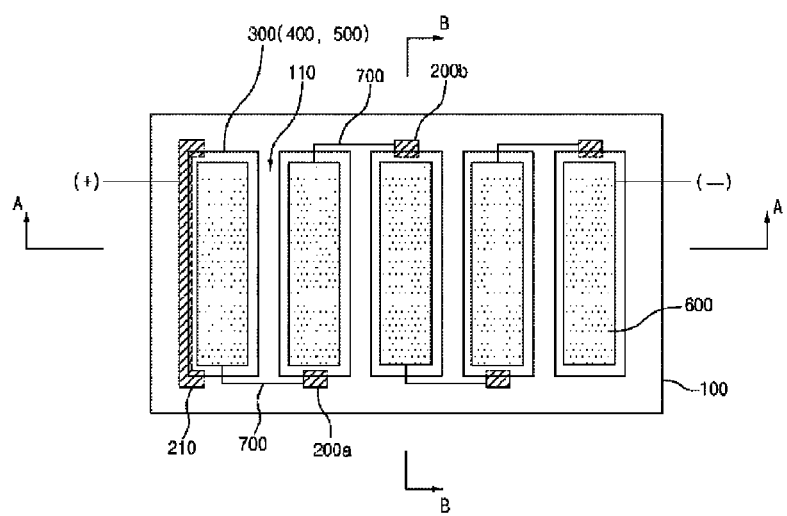
FIG. 2A is a plan view illustrating a thin film type solar cell according to the first embodiment of the present invention.
FIG. 2B is a cross section view along A-A of FIG. 2A.
FIG. 2C is a cross section view along B-B of FIG. 2A.
Figure 2:
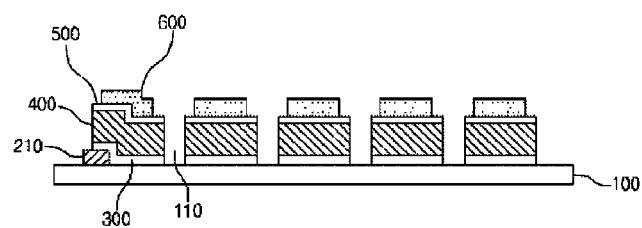
Figure 2:
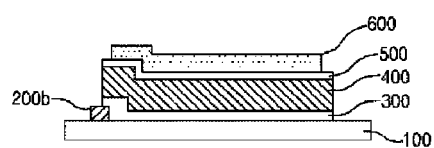

FIG. 2A is a plan view illustrating a thin film type solar cell according to the first embodiment of the present invention, FIG. 2B is a cross section view along A-A of FIG. 2A, and FIG. 2C is a cross section view along B-B of FIG. 2A.

As shown in FIGS. 2A to 2C, the thin film type solar cell according to the first embodiment of the present invention includes a substrate 100, auxiliary electrodes 200a and 200b, front electrodes 300, semiconductor layer patterns 400, transparent conductive layer patterns 500, and rear electrodes 600.

At this time, the substrate 100 may be formed of glass or transparent plastic. Also, a plurality of separating parts 110 are interposed between each of the front electrodes 300, the semiconductor layer patterns 400, the transparent conductive layer patterns 500, and the rear electrodes 600, whereby they are arranged at fixed intervals owing to the interposed separating parts 110. That is, the solar cell according to the first embodiment of the present invention is divided into a plurality of unit cells. The separating parts 110 divide the solar cell into the plurality of unit cells, wherein the separating parts 110 are formed in type of straight-line grooves at a first direction (for example, a short-side direction of substrate in FIG. 2A).

According as the adjoining front and rear electrodes 300 and 600 are electrically connected with each other by the auxiliary electrodes 200a and 200b, the plurality of unit cells are connected in series, thereby forming the solar cell with the plurality of unit cells divided therein.

The auxiliary electrodes 200a and 200b are connected with the front electrodes 300 through the direct contact, and are connected with the rear electrodes 600 through a predetermined connection line 700. Accordingly, the front electrodes 300 are electrically connected with the rear electrodes 600.

The auxiliary electrodes 200a and 200b may be directly connected with the lower surface of the front electrodes 300, or may be directly connected with the upper surface of the front electrodes 300.

The auxiliary electrodes 200a and 200b may be comprised of the first auxiliary electrode 200a connected with one end of the front electrode 300, and the second auxiliary electrode 200b connected with the other end of the front electrode 300. The first auxiliary electrode 200a and the second auxiliary electrode 200b may be arranged in alternation.

Since the auxiliary electrodes 200a and 200b are connected with the rear electrodes 600 through the predetermined connection line 700, the predetermined portions of the auxiliary electrodes 200a and 200b may be exposed to the external so as to form the predetermined connection line 700. For formation of the predetermined connection line 700, the front electrodes 300, the semiconductor layer patterns 400, the transparent conductive layer patterns 500, and the rear electrodes 600 are not formed on the predetermined portions of the auxiliary electrodes 200a and 200b. However, if the connection line 700 is formed by the lateral side of the auxiliary electrodes 200a and 200b, the upper portions of the auxiliary electrodes 200a and 200b are not exposed to the external.

In order to connect the outermost front electrode 300 among the front electrodes 300 with an external circuit, a bus line 210 is connected with one side of the outermost front electrode 300. The bus line 210 may be directly connected with the lower surface or upper surface of the front electrodes 300, and may be formed at the same layer as the auxiliary electrodes 200a and 200b when performing a procedure of forming the auxiliary electrodes 200a and 200b.

To form a connection line with the external circuit, the predetermined portion of the bus line 210 is exposed to the external. For formation of the connection line, the front electrodes 300, the semiconductor layer patterns 400, the transparent conductive layer patterns 500, and the rear electrodes 600 are not formed on the predetermined portions of the bus line 210.

The auxiliary electrodes 200a and 200b and the bus line 210 may be formed of metal such as Ag, Al, Ag$^+$Al, Ag$^+$Mg, Ag$^+$Mn, Ag$^+$Sb, Ag$^+$Zn, Ag$^+$Mo, Ag$^+$Ni, Ag$^+$Cu, or Ag$^+$Al$^+$Zn by a screen printing method, an inkjet printing method, a gravure printing method, or a micro-contact printing method.

In the case of the screen printing method, a material is transferred to a predetermined body through the use of squeeze. The inkjet printing method sprays a material onto a predetermined body through the use of inkjet, to thereby form a predetermined pattern thereon. In the case of the gravure printing method, a material is coated on an intaglio plate, and then the coated material is transferred to a predetermined body, thereby forming a predetermined pattern on the predetermined body. The micro-contact printing method forms a predetermined pattern of material on a predetermined body through the use of predetermined mold.

The front electrodes 300 are arranged at fixed intervals owing to the interposed separating parts 110, wherein the front electrodes 300 are formed of a transparent conductive material such as ZnO, ZnO:B, ZnO:Al, ZnO:H, $SnO_2$, $SnO_2$:F, or ITO (Indium Tin Oxide) by sputtering or MOCVD (Metal Organic Chemical Vapor Deposition).

The front electrode 300 corresponds to a solar ray incidence face, so that it is important for the front electrode 300 to transmit the solar ray into the inside of the solar cell with the minimized loss. For this, a texturing process may be additionally performed to the front electrode 300. Through the texturing process, a surface of material layer becomes uneven, that is, texture structure, by an etching process using photolithography, an anisotropic etching process using a chemical solution, or a mechanical scribing process. According as the texturing process is performed to the front electrode 300, a solar-ray reflection ratio on the front electrode 300 of the solar cell is decreased and a solar-ray absorbing ratio in the solar cell is increased owing to a dispersion of solar ray, thereby improving the efficiency of solar cell.

The semiconductor layer patterns 400 are formed on the front electrodes 300. In this case, the separating parts 110 are interposed between each of the semiconductor layer patterns 400, that is, the semiconductor layer patterns 400 are arranged at fixed intervals owing to the interposed separating parts 110. The semiconductor layer patterns 400 may be formed of a silicon-based semiconductor material by a plasma CVD method, wherein the silicon-based semiconductor material may be amorphous silicon (a-Si:H) or microcrystalline silicon (uc-Si:H).

Each of the semiconductor layer patterns 400 may be formed in a PIN structure where a P(positive)-type semiconductor layer, an I(intrinsic)-type semiconductor layer, and an N(negative)-type semiconductor layer are deposited in sequence. As the semiconductor layer pattern 400 is formed in the PIN structure, depletion occurs in the I-type semiconductor layer by the P-type and N-type semiconductor layers, whereby an electric field is generated therein. Also, holes and electrons generated by the solar ray are drifted by the electric field, and are then collected in the respective P-type and N-type semiconductor layers by the electric field. In the meantime, if the semiconductor layer pattern 400 is formed in the PIN structure, it is preferable to form the P-type semiconductor layer firstly, and to form the I-type and N-type semiconductor layers secondly. This is because a drift mobility of the hole is less than a drift mobility of the electron. In order to maximize the collection efficiency by the incident ray, the P-type semiconductor layer is formed adjacent to the solar ray incidence face.

The transparent conductive layer patterns 500 are formed on the semiconductor layer patterns 400. In this case, the separating parts 110 are interposed between each of the transparent conductive layer patterns 500, that is, the transparent conductive layer patterns 500 are arranged at fixed intervals owing to the interposed separating parts 110. The transparent conductive layer patterns 500 may be formed of a transparent conductive material such as ZnO, ZnO:B, ZnO:Al, ZnO:H, or Ag by sputtering or MOCVD (Metal Organic Chemical Vapor Deposition).

It is possible to omit the transparent conductive layer patterns 500. However, it is preferable that the transparent conductive layer patterns 500 be formed so as to improve the efficiency of solar cell. That is, when forming the transparent conductive layer patterns 500, the solar ray passes through the semiconductor layer patterns 400, and then passes through the transparent conductive layer patterns 500. In this case, the solar ray passing through the transparent conductive layer patterns 500 is dispersed at different angles. Thus, after the solar ray is reflected on the rear electrodes 600, the ratio of solar ray re-incidence is increased on the semiconductor layer patterns 400.

The rear electrodes 600 are formed on the transparent conductive layer patterns 500. In this case, the separating parts 110 are interposed between each of the rear electrodes 600, that is, the rear electrodes 600 are arranged at fixed intervals owing to the interposed separating parts 110. The rear electrodes 600 may be formed of metal such as Ag, Al, $Ag^+Al$, $Ag^+Mg$, $Ag^+Mn$, $Ag^+Sb$, $Ag^+Zn$, $Ag^+Mo$, $Ag^+Ni$, $Ag^+Cu$, or $Ag^+Al^+Zn$ by the screen printing method, the inkjet printing method, the gravure printing method, or the micro-contact printing method.

As explained above, the rear electrodes 600 are connected with the auxiliary electrodes 200a and 200b by the predetermined connection line 700. Among the plurality of rear electrodes 600, the outermost rear electrode 600 is connected with the external circuit.

According as the adjoining front and rear electrodes 300 and 600 are electrically connected with each other by the auxiliary electrodes 200a and 200b, the plurality of unit cells are connected in series. Also, the bus line 210 connected with the outermost front electrode 300 is formed at one side of the substrate 100, and the outermost rear electrode 600 is formed at the other side of the substrate 100, whereby the bus line 210 and the outermost rear electrode 600 respectively form the (+) and (−) polarities of the thin film type solar cell.

Since the separating parts 100 for dividing the solar cell into the unit cells are formed in type of the straight-line grooves, it is possible to obtain a visible range through the separating parts 110, whereby it can be used in substitution for glass windows of a building. In more detail, if the solar cell according to the present invention is manufactured in a transmitting type, it is possible to realize external facing materials for the building and an apparatus for converting the solar energy into electricity at the same time. Accordingly, there is no requirement for additionally installing an apparatus for collecting the solar ray in the existing building, so that it is possible to improve spatial efficiency and to reduce installation cost.

Wherever possible, the same reference numbers will be used throughout the drawings related with the second and third embodiments of the present invention to refer to the same parts as those used in the drawings related with the first embodiment of the present invention, and the detailed explanation about the same parts will be omitted.

Second Embodiment

Figure 3:
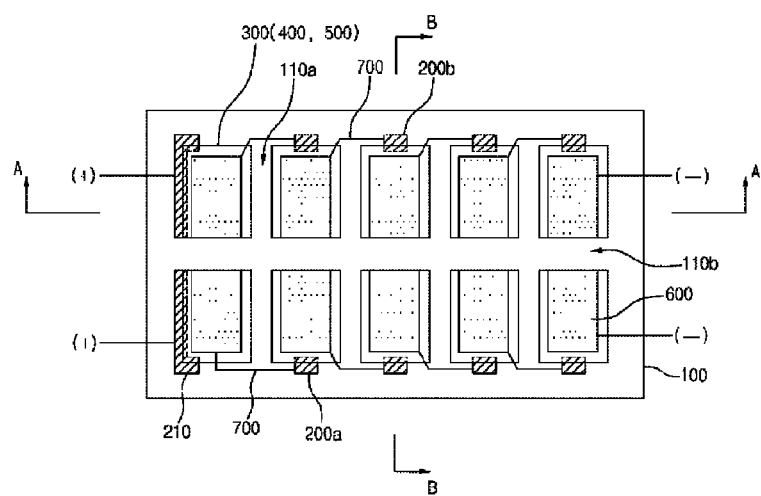
FIG. 3A is a plan view illustrating a thin film type solar cell according to the second embodiment of the present invention.
FIG. 3B is a cross section view along A-A of FIG. 3A.
FIG. 3C is a cross section view along B-B of FIG. 3A.
Figure 3:
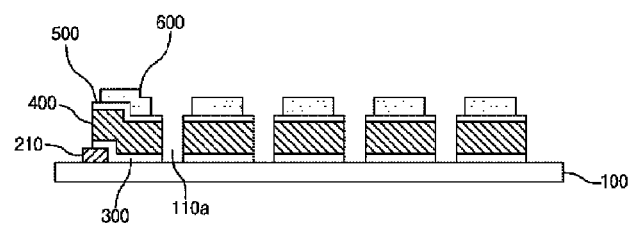
Figure 3:
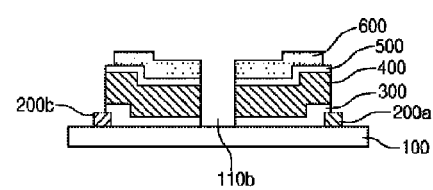

FIG. 3A is a plan view illustrating a thin film type solar cell according to the second embodiment of the present invention, FIG. 3B is a cross section view along A-A of FIG. 3A, and FIG. 3C is a cross section view along B-B of FIG. 3A.

Except for separating parts 110a and 110b for dividing a solar cell into a plurality of unit cells, the thin film type solar cell according to the second embodiment of the present invention is identical in structure to the thin film type solar cell according to the first embodiment of the present invention.

The thin film type solar cell according to the second embodiment of the present invention is comprised of a plurality of first straight-line grooves 110a arranged at a first direction (for example, a short-side direction of substrate in FIG. 3A), and a second straight-line groove 110b arranged at a second direction (for example, a long-side direction of substrate in FIG. 3A), wherein the first direction is perpendicular to the second direction.

FIG. 3A shows only one second straight-line groove 110b. However, if the substrate 100 increases in size, it is possible to form the plurality of second-straight-line grooves 110b.

According as the separating parts 110a and 110b are respectively formed at the first and second directions, the increased number of unit cells enables the improvement of cell efficiency.

As shown in FIG. 3A, the second straight-line grooves 110b corresponding to the separating parts 110b are additionally provided at the second direction (for example, the long-side direction of substrate in FIG. 3A). In this case, all auxiliary electrodes 200a in the unit cells positioned in the lower part of the substrate 100 with respect to the second straight-line groove 110b are connected with one end of the front electrodes 300. Also, all auxiliary electrodes 200b in the unit cells positioned in the upper part of the substrate 100 with respect to the second straight-line groove 110b are connected with the other end of the front electrodes 300. However, it is not limited to this. Like the first embodiment of the present invention (See FIG. 2A), the respective auxiliary electrodes 200a and 200b in the unit cells positioned in the lower or upper part of the substrate with respect to the second straight-line 110b are alternately connected with one end and the other end of the front electrodes 300.

Third Embodiment

Figure 4:
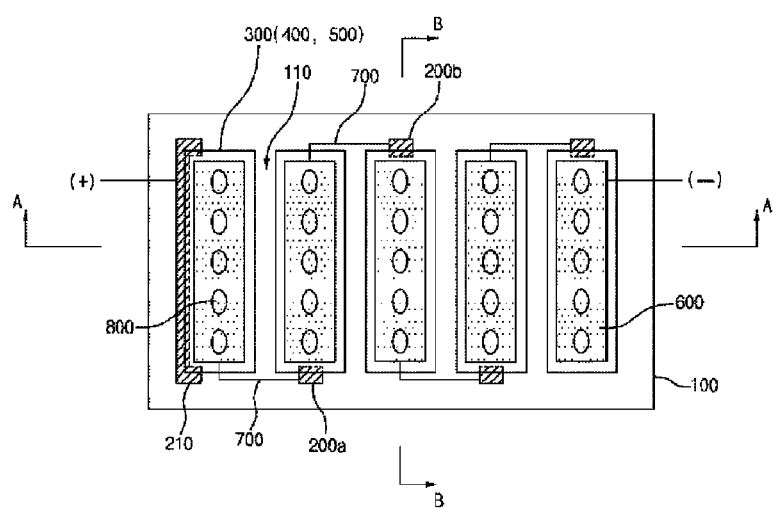
FIG. 4A is a plan view illustrating a thin film type solar cell according to the third embodiment of the present invention.
FIG. 4B is a cross section view along A-A of FIG. 4A.
FIG. 4C is a cross section view along B-B of FIG. 4A.
Figure 4:
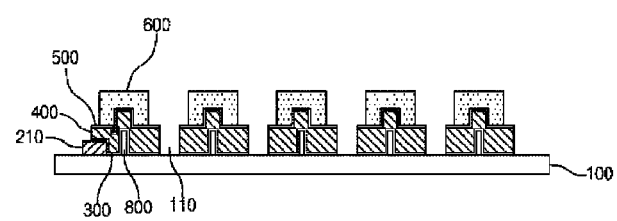
Figure 4:
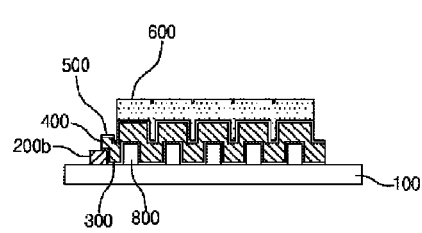

FIG. 4A is a plan view illustrating a thin film type solar cell according to the third embodiment of the present invention, FIG. 4B is a cross section view along A-A of FIG. 4A, and FIG. 4C is a cross section view along B-B of FIG. 4A.

Except that an insulating layer pattern 800 is additionally formed under the semiconductor layer pattern 400, the thin film type solar cell according to the third embodiment of the present invention is identical in structure to the thin film type solar cell according to the first embodiment of the present invention.

According as the insulating layer pattern 800 is formed under the semiconductor layer pattern 400, the entire size of the semiconductor layer pattern 400 is increased so that the solar cell efficiency is improved.

That is, in comparison to the case of omitting the insulating layer pattern 800, the case of forming the insulating layer pattern 800 can realize higher solar cell efficiency owing to the increased entire size of the semiconductor layer pattern 400 on the insulating layer pattern 800. Thus, a height of insulating layer pattern 800 is larger than a predetermined value, and more preferably, the insulating layer pattern 800 is higher than the auxiliary electrodes 200a and 200b and the bus line 210.

The insulating layer pattern 800 can improve a light-capturing ratio. If forming the insulating layer pattern 800, the solar ray transmitted through the lower surface of the insulating layer pattern 800 is refracted and dispersed at different angles, thereby improving a light-absorbing ratio on the semiconductor layer pattern 400.

The insulating layer pattern 800 may be formed on the lower surface of the front electrode 300 (See FIG. 4B), or may be formed on the upper surface of the front electrode 300 (not shown). As shown in FIG. 4B, when the insulating layer pattern 800 is formed on the lower surface of the front electrode 300, the front electrode 300 is positioned underneath the semiconductor layer pattern 400, so that it is possible to realize the higher solar cell efficiency in comparison to the case of forming the insulating layer pattern 800 between the front electrode 300 and the semiconductor layer pattern 400.

The insulating layer pattern 800 is formed of a transparent insulating material so as to prevent a light-transmitting ratio from being lowered, for example, $SiO_2$, $TiO_2$, $SiN_x$, SiON, or transparent polymer.

The insulating layer patterns 800 are arranged at fixed intervals, wherein each of the insulating layer patterns 800 is formed of an insulating-material pattern with an elliptical-shaped horizontal cross section, preferably. Even though the insulating layer pattern 800 is formed of the transparent insulating material, the light-transmitting ratio may be lowered with the increased horizontal cross section of the insulating layer pattern 800. Thus, it is preferable that the insulating layer pattern 800 have the small-sized horizontal cross section. However, the insulating layer patterns are not limited to the aforementioned shape and pattern. Instead of arranging the insulating layer patterns 800 at fixed intervals, the insulating material may be provided along a straight line. Also, the horizontal cross section of the insulating layer pattern may be a triangle, a polygon such as a quadrangle, or a circle.

The insulating layer pattern 800 may be formed by a screen printing method, an inkjet printing method, a gravure printing method, or a micro-contact printing method. Also, the insulating layer pattern 800 may be formed by photolithography or sand blast. The photolithography is performed with sequential steps of forming a mask pattern with photoresist through exposure and development, and forming a predetermined pattern through dry-etching or wet-etching with the mask pattern. The sand blast is performed with sequential steps of forming a mask pattern, and forming a predetermined pattern by spraying abrasive powder such as sand.

Although not shown, a thin film type solar cell, to which both second and third embodiments of the present invention are applied together, can be included. That is, the insulating layer pattern 800 is formed underneath the semiconductor layer pattern 400, and the separating parts 110a and 110b are comprised of the plurality of first straight-line grooves 110a arranged at the first direction, and the second straight-line groove 110b arranged at the second direction, wherein the first direction is perpendicular to the second direction.

<Method for Manufacturing Thin Film Type Solar Cell>

FIGS. 5A to 5D are cross section views illustrating a method for manufacturing a thin film type solar cell according to one embodiment of the present invention, which relate to the method for manufacturing the thin film type solar cell according to the first or second embodiment of the present invention, wherein FIGS. 5A to 5D are cross section views along A-A of FIG. 2A or 3A.

Figure 5:
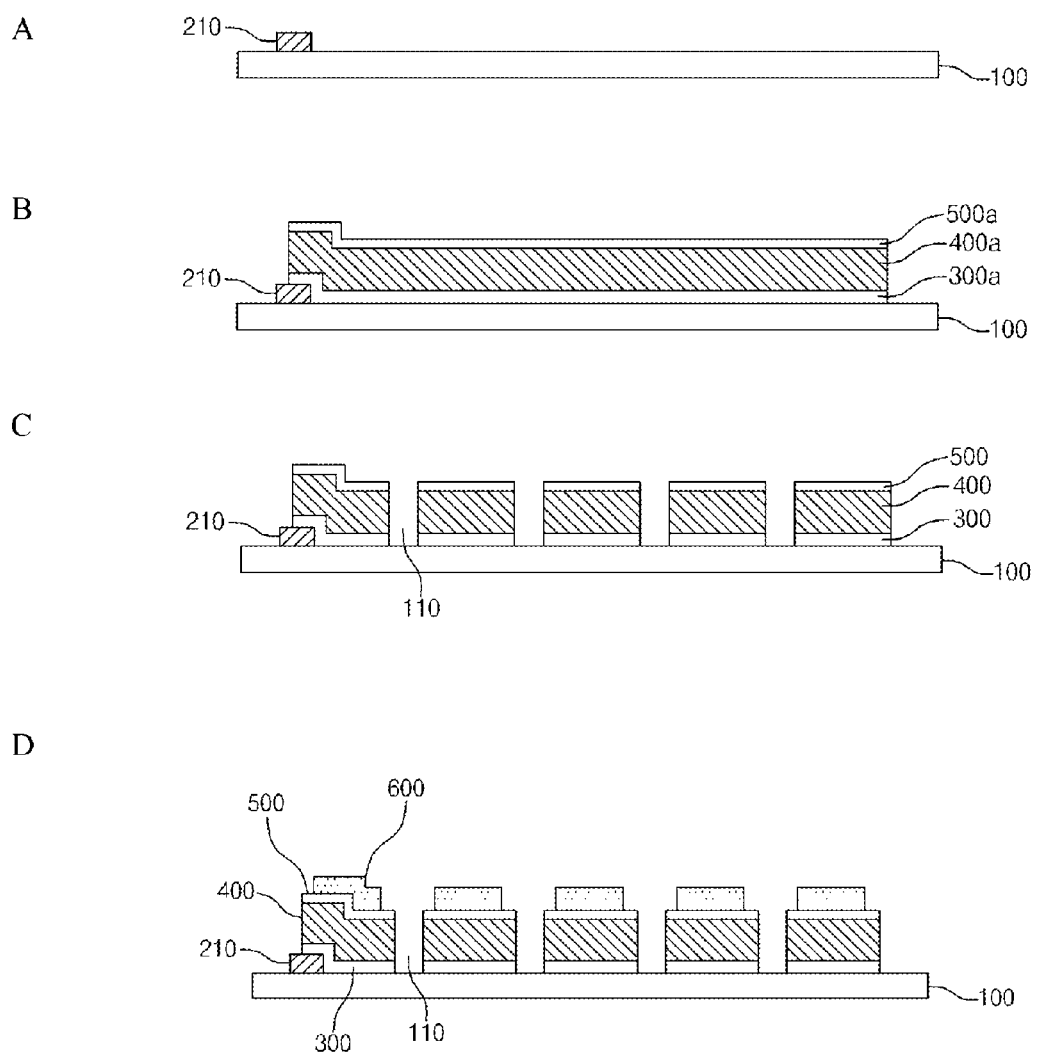
FIGS. 5A to 5D are cross section views illustrating a method for manufacturing a thin film type solar cell according to one embodiment of the present invention.

First, as shown in FIG. 5A, the bus line 210 and the auxiliary electrodes (See the reference numbers 200a and 200b of FIG. 2A and FIG. 2B) are formed on the substrate 100. The substrate 100 may be formed of glass or transparent plastic.

The bus line 210 is patterned to be in contact with the predetermined portions on one side of the outermost front electrode. The auxiliary electrode is patterned to be in contact with the predetermined portions on one side and the other side of the front electrode. The bus line 210 and the auxiliary electrode may be formed of metal such as Ag, Al, $Ag^+Al$, $Ag^+Mg$, $Ag^+Mn$, $Ag^+Sb$, $Ag^+Zn$, $Ag^+Mo$, $Ag^+Ni$, $Ag^+Cu$, or $Ag^+Al^+Zn$ by the screen printing method, the inkjet printing method, the gravure printing method, or the micro-contact printing method.

As shown in FIG. 5B, a front electrode layer 300a, a semiconductor layer 400a, and a transparent conductive layer 500a are sequentially deposited on the predetermined portions of the bus line 210 and the auxiliary electrode, and the substrate 100.

To form the connection line to be connected with the external circuit, the predetermined portion of the bus line 210 is exposed to the external. Also, to form the connection line with rear electrode, the predetermined portion of the auxiliary electrode is exposed to the external. Accordingly, the front electrode layer 300a, the semiconductor layer 400a, and the transparent conductive layer 500 are formed on the predetermined portions of the bus line 210 and the auxiliary electrode. Thus, the procedure of forming the front electrode layer 300a, the semiconductor layer 400a, and the transparent conductive layer 500a is performed after masking the predetermined portions, whereby the predetermined portions of the bus line 210 and the auxiliary electrode are exposed to the external.

The front electrode layer 300a is formed of the transparent conductive material such as ZnO, ZnO:B, ZnO:Al, ZnO:H, $SnO_2$, $SnO_2$:F, or ITO (Indium Tin Oxide) by sputtering or MOCVD (Metal Organic Chemical Vapor Deposition). Also, the front electrode layer 300a has the uneven surface by texturing.

The semiconductor layer 400a may be formed of the silicon-based semiconductor material by the plasma CVD method. The semiconductor layer 400a is formed in the PIN structure where the P(positive)-type semiconductor layer, the I(intrinsic)-type semiconductor layer, and the N(negative)-type semiconductor layer are deposited in sequence.

The transparent conductive layer 500a may be formed of the transparent conductive material such as ZnO, ZnO:B, ZnO:Al, ZnO:H, or Ag by sputtering or MOCVD (Metal Organic Chemical Vapor Deposition). The transparent conductive layer 500a may be omitted.

In one embodiment of the present invention, the bus line 210 and the auxiliary electrode are formed as shown in FIG. 5A, and the front electrode layer 300a is formed on the predetermined portions of the bus line 210 and the auxiliary electrode as shown in FIG. 5B, whereby the bus line 210 and the auxiliary electrode may be in contact with the lower surface of the front electrodes 300 arranged at fixed intervals by the step of forming the separating parts. In another embodiment of the present invention, the front electrode layer 300a is firstly formed, and the bus line 210 and the auxiliary electrode are formed on the predetermined portions of the front electrode layer 300a, whereby the bus line 210 and the auxiliary electrode may be in contact with the upper surface of the front electrodes 300.

Next, as shown in FIG. 5C, the separating parts 110 for dividing the solar cell into the plurality of unit cells are formed by removing the predetermined portions of the front electrode layer 300a, the semiconductor layer 400a, and the transparent conductive layer 500a. In this case, the front electrodes 300, the semiconductor layer patterns 400, and the transparent conductive layer patterns 500 are arranged at fixed intervals by the separating parts 110.

The procedure of forming the separating parts 110 may be performed by the laser-scribing method. The procedure of forming the separating parts 110 may be comprised of forming the plurality of straight-line grooves 110 at the first direction as shown in FIG. 2A, or may be comprised of forming the plurality of first straight-line grooves 110a at the first direction and forming the second straight-line groove 110b at the second direction being perpendicular to the first direction as shown in FIG. 3A.

As shown in FIG. 5D, the rear electrodes 600 are formed on the transparent conductive layer patterns 500. The rear electrodes 600 are arranged at fixed intervals owing to the interposed separating parts 110, wherein the rear electrodes 600 are formed of the metal such as Ag, Al, $Ag^+Al$, $Ag^+Mg$, $Ag^+Mn$, $Ag^+Sb$, $Ag^+Zn$, $Ag^+Mo$, $Ag^+Ni$, $Ag^+Cu$, or $Ag^+Al^+Zn$ by the screen printing method, the inkjet printing method, the gravure printing method, or the micro-contact printing method.

As the connection line is formed to electrically connect the rear electrode 600 with the auxiliary electrode (See the reference number 700 of FIGS. 2A and 3A), the process of manufacturing the thin film type solar cell is completed.

FIGS. 6A to 6D are cross section views illustrating a method for manufacturing a thin film type solar cell according to another embodiment of the present invention, which relate to the method for manufacturing the thin film type solar cell according to the third embodiment of the present invention, wherein FIGS. 6A to 6D are cross section views along A-A of FIG. 4A.

Except that there is an additional procedure for forming the insulating layer pattern underneath the semiconductor layer pattern 400, the method related with FIGS. 6A to 6D is identical to the method related with FIGS. 5A to 5D, whereby the detailed explanation about the same parts will be omitted.

Figure 6:
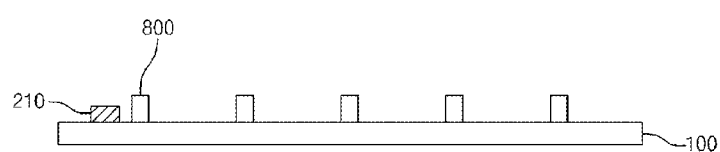
FIGS. 6A to 6D are cross section views illustrating a method for manufacturing a thin film type solar cell according to another embodiment of the present invention.
Figure 6:
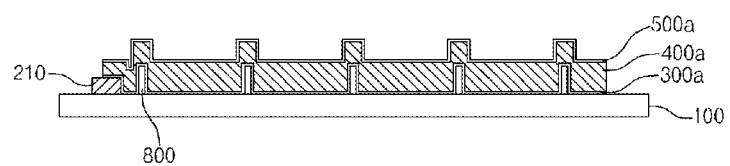
Figure 6:
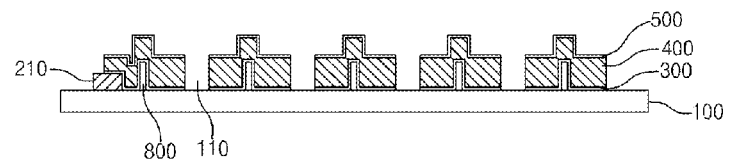
Figure 6:
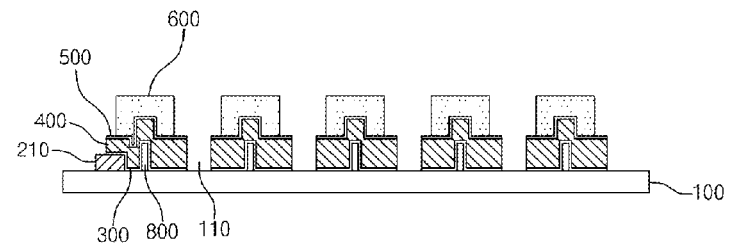

First, as shown in FIG. 6A, the bus line 210 and the auxiliary electrode (See the reference number 200a and 200b of FIG. 4A) are formed on the substrate 100, and then the insulating layer pattern 800 is formed. At this time, the bus line 210 and the auxiliary electrode may be firstly formed, and then the insulating layer pattern 800 may be formed secondly. In another way, the insulating layer pattern 800 may be firstly formed, and then the bus line 210 and the auxiliary electrode may be formed secondly.

The insulating layer pattern 800 may be formed of the transparent insulating material such as $SiO_2$, $TiO_2$, $SiN_x$, SiON, or transparent polymer. The insulating layer pattern 800 may be formed by the procedure of arranging the insulating-material patterns with the elliptical-shaped horizontal cross section at fixed intervals through the use of screen printing method, inkjet printing method, gravure printing method, or micro-contact printing method. Also, the insulating layer pattern 800 may be formed through the use of photolithography or sand blast. Preferably, the insulating layer pattern 800 is higher than the bus line 210 and the auxiliary electrode.

As shown in FIG. 6B, the front electrode layer 300a, the semiconductor layer 400a, and the transparent conductive layer 500a are sequentially formed on the predetermined portions of the bus line 210 and auxiliary electrode and on the insulating layer pattern 800.

In one embodiment of the present invention, the insulating layer pattern 800 may be formed on the lower surface of the front electrodes 300 arranged at fixed intervals. In another embodiment of the present invention, the insulating layer pattern 800 may be formed on the upper surface of the front electrodes 300 by the steps of forming the front electrode layer 300a first, and then forming the insulating layer pattern 800.

As shown in FIG. 6C, the separating parts 110 for dividing the solar cell into the plurality of unit cells are formed by removing the predetermined portions of the front electrode layer 300a, the semiconductor layer 400a, and the transparent conductive layer 500a. Thus, the front electrodes 300, the semiconductor layer patterns 400, and the transparent conductive layer patterns 500 are arranged at fixed intervals by the separating parts 110.

As shown in FIG. 6D, the rear electrode 600 is formed on the transparent conductive layer pattern 500. As the connection line (See the reference number 700 of FIG. 4A) is formed to electrically connect the rear electrode 600 with the auxiliary electrode, the process for manufacturing the solar cell is completed.

Accordingly, the thin film type solar cell according to the present invention and the method for manufacturing the same has the following advantages.

First, the front electrode is electrically connected with the rear electrode through the use of auxiliary electrode, so that it is possible to minimize the laser-scribing procedure for dividing the solar cell into the plurality of unit cells, thereby preventing the particles from being generated. Thus, the thin film type solar cell according to the present invention and the method for manufacturing the same can overcome the various problems caused by the particles, for example, the contamination of substrate, the short of device, the increased manufacturing cost, and the excessive scribing on the undesired layer.

Second, as the insulating layer pattern is formed underneath the semiconductor layer pattern, the entire size of the semiconductor layer pattern is increased so that the solar cell efficiency is improved. In addition, the increased light-capturing ratio enables the improvement of light-absorbing ratio.

Third, the predetermined separating part is formed between the unit cells, whereby the visible range can be obtained through the separating part. That is, the thin film type solar cell according to the present invention can be used in substitution for the glass windows of building. In more detail, if the solar cell according to the present invention is manufactured in the transmitting type, it is possible to realize external facing materials for the building and the apparatus for converting the solar energy into electricity at the same time. Accordingly, there is no requirement for additionally installing the apparatus for collecting the solar ray in the existing building, so that it is possible to improve spatial efficiency and to reduce installation cost.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A thin film type solar cell comprising:
   a substrate;
   front electrodes arranged at fixed intervals on the substrate by separating parts for dividing the solar cell into a plurality of unit cells, wherein each separating part is interposed between the front electrodes;
   semiconductor layer patterns arranged at fixed intervals on the front electrodes by the interposed separating parts;
   rear electrodes arranged at fixed intervals on the semiconductor layer patterns by the interposed separating parts; and
   auxiliary electrodes to electrically connect the front electrodes with the rear electrodes,
   wherein the auxiliary electrodes are directly connected with a lower surface or an upper surface of the front electrodes, the auxiliary electrodes being connected with the rear electrodes through a connection line, and wherein the auxiliary electrodes are comprised of a first auxiliary electrode connected only with one end of the front electrodes, and a second auxiliary electrode connected with another end of the front electrodes.

2. The thin film type solar cell according to claim 1, wherein the first and second auxiliary electrodes are arranged alternately.

3. The thin film type solar cell according to claim 1, further comprising a bus line connected with one side of an outermost front electrode among the front electrodes, so as to connect the outermost front electrode with an external circuit.

4. The thin film type solar cell according to claim 1, wherein the front electrodes, the semiconductor layer patterns, and the rear electrodes are not formed on predetermined portions of the auxiliary electrodes so as to expose the predetermined portions of the auxiliary electrodes.

5. The thin film type solar cell according to claim 1, wherein the front electrodes, the semiconductor layer patterns, and the rear electrodes are not formed on predetermined portions of the bus line so as to expose the predetermined portions of the bus line.

6. The thin film type solar cell according to claim 1, wherein a transparent conductive layer pattern is additionally formed between the semiconductor layer patterns and the rear electrodes.

7. The thin film type solar cell according to claim 1, wherein the separating parts comprise one or more straight-line grooves in a first direction.

8. The thin film type solar cell according to claim 7, wherein the separating parts further comprises one or more straight-line grooves at a second direction being in perpendicular to the first direction.

9. The thin film type solar cell according to claim 1, wherein an insulating layer pattern is additionally formed on the lower surface or the upper surface of the front electrode.

10. The thin film type solar cell according to claim 9, wherein the insulating layer pattern is formed in a structure of arranging transparent insulating-material patterns with an elliptical-shaped horizontal cross section at fixed intervals.

11. The thin film type solar cell according to claim 9, wherein the insulating layer pattern is higher than the auxiliary electrode.

12. A method for manufacturing a thin film type solar cell comprising:
   forming a front electrode layer on a substrate;
   forming a semiconductor layer on the front electrode layer;
   forming separating parts for dividing the solar cell into a plurality of unit cells by removing predetermined portions of the front electrode layer and semiconductor layer, so as to form front electrodes and semiconductor layer patterns at fixed intervals by the interposed separating parts;
   forming rear electrodes arranged at fixed intervals on the semiconductor layer patterns by the interposed separating parts;
   forming auxiliary electrodes being in contact with predetermined portions of the front electrode patterns; and
   forming a connection line to electrically connect the auxiliary electrodes with the rear electrodes, wherein the step of forming the auxiliary electrodes is comprised of forming a first auxiliary electrode connected only with one end of the front electrodes, and forming a second auxiliary electrode connected with another end of the front electrodes.

13. The method according to claim 12, wherein the auxiliary electrodes are in contact with a lower surface of the front electrodes by performing the step of forming the auxiliary electrodes before the step of forming the front electrode layer.

14. The method according to claim 12, wherein the auxiliary electrodes are in contact with an upper surface of the front electrodes by performing the step of forming the auxiliary electrodes after the step of forming the front electrode layer.

15. The method according to claim 12, further comprising performing a step of forming a bus line connected with one side of an outermost front electrode so as to electrically connect the outermost front electrode with an external circuit, simultaneously with the step of forming the auxiliary electrodes.

16. The method according to claim 12, wherein the respective steps of forming the front electrode layer, the semiconductor layer and the rear electrodes are performed while masking predetermined portions of the auxiliary electrodes, so as to expose the predetermined portions of the auxiliary electrodes to an external circuit.

17. The method according to claim 15, wherein the respective steps of forming the front electrode layer, the semiconductor layer and the rear electrodes are performed while masking predetermined portions of the bus line, so as to expose the predetermined portions of the bus line to an external circuit.

18. The method according to claim 12, wherein the step of forming the separating parts comprises forming one or more straight-line grooves in a first direction.

19. The method according to claim 18, wherein the step of forming the separating parts further comprises forming one or more straight-line grooves at a second direction being in perpendicular to the first direction.

20. The method according to claim 12, further comprising forming an insulating layer pattern on the lower surface or the upper surface of the front electrode.

21. The method according to claim 20, wherein the step of forming the insulating layer pattern is comprised of arranging transparent insulating-material patterns with an elliptical-shaped horizontal cross section at fixed intervals.

22. The method according to claim 20, wherein the step of forming the insulating layer pattern is performed to obtain the insulating layer pattern which is higher than the auxiliary electrode.

23. The method according to claim 20, wherein the step of forming the insulating layer pattern is performed by a screen printing method, an inkjet printing method, a gravure printing method, a micro-contact printing method, photolithography or sand blast.

* * * * *